United States Patent
Carballo

(10) Patent No.: US 6,545,519 B1
(45) Date of Patent: Apr. 8, 2003

(54) LEVEL SHIFTING, SCANNABLE LATCH, AND METHOD THEREFOR

(75) Inventor: Juan-Antonio Carballo, Austin, TX (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/112,487

(22) Filed: Mar. 28, 2002

(51) Int. Cl.[7] .............................................. H03K 3/289
(52) U.S. Cl. ........................................ 327/211; 327/210
(58) Field of Search ............................... 327/202, 203, 327/204, 218, 219, 210, 211, 212, 208, 215, 333; 326/95, 96, 97, 98; 714/726

(56) References Cited

U.S. PATENT DOCUMENTS

| 5,153,451 A | 10/1992 | Yamamura et al. ......... 327/333 |
| 5,463,338 A | * 10/1995 | Yurash ........................ 327/202 |
| 5,689,517 A | * 11/1997 | Ruparel ....................... 714/731 |
| 5,959,490 A | 9/1999 | Candage et al. ............ 327/333 |

OTHER PUBLICATIONS

N. Otsuka et al., "Circuit Techniques for 1.5–V Power Supply Flash Memory", IEEE Journal of Solid State Circuits, vol. 32, No. 8, Aug. 1997.

K. Usami et al., "Clustered Voltage Sealing Technique for Low–Power Design", Proceedings 1995 International Symposium on Low Power Design, Apr. 1995.

* cited by examiner

Primary Examiner—Timothy P. Callahan
Assistant Examiner—Linh Nguyen
(74) Attorney, Agent, or Firm—Anthony England; Casimer K. Salys

(57) ABSTRACT

Latch circuitry has a data input stage for sampling a first input signal responsive to a first timing signal and generating a signal on an intermediate node in the latch circuitry. The latch circuitry also has a scan input stage for sampling a second input signal responsive to a second timing signal, and generating a signal on the intermediate node. The latch circuitry also has an output stage for generating an output signal on an output node of the latch circuitry responsive to the signal on the intermediate node and a third timing signal. The data input signal has a maximum voltage level and at least one stage of the latch circuitry is operable to effectively shift the voltage level so that the output signal has a higher maximum voltage level than that of the data input signal.

20 Claims, 3 Drawing Sheets

LEVEL SHIFTING, SCANNABLE LATCH, AND METHOD THEREFOR

BACKGROUND

1. Field of the Invention

This invention concerns latch circuitry and more particularly concerns latch circuitry that apertures an input signal, i.e., "data," and outputs a signal having a higher maximum voltage level, in effect shifting the maximum voltage level of the input signal.

2. Related Art

As systems-on-a-chip become more complex, the circuitry on a chip is increasingly put together from disparate designs. Moreover, to reduce power consumption on a chip it is common include some portions of logic circuitry that operate at a lower voltage (and thus lower power), and other portions, such as analog circuits or critical high speed circuits, that operate at a higher voltage due to design constraints. Consequently, it is increasingly necessary to patch together portions of logic circuitry using level shifting circuitry that operates across voltage domains. High-performance designs for such level shifting circuitry are more difficult for the case where an input signal has a lower maximum voltage than the desired output signal, that is, where the circuitry is in effect shifting from low to high voltage.

Besides needing to shift the voltage levels of circuitry portions, is also commonly necessary to synchronize the timing of circuitry portions at their interfaces using latch circuitry, which for testing purposes must often be scannable. Conventionally, the voltage level shifting and the latching functions are performed by distinctly different circuitry. Thus, at certain logic circuitry boundaries there conventionally exists both voltage level shifting circuitry and latching circuitry. This arrangement takes up more space and consumes more power on a chip that is desirable. Consequently, there is a need for improved voltage level shifting and latching circuitry.

SUMMARY

The foregoing need is addressed in the present invention. According to one form of the invention latch circuitry has a first input stage for sampling a data input signal responsive to a first timing signal and generating a signal on an intermediate node in the latch circuitry. The latch circuitry also has a second input stage for sampling a scan input signal responsive to a second timing signal, and generating a signal on the intermediate node. The latch circuitry also has an output stage for generating an output signal on an output node of the latch circuitry responsive to the signal on the intermediate node and a third timing signal. The data input signal has a maximum voltage level and at least one stage of the latch circuitry is operable to effectively shift the voltage level so that the output signal has a higher maximum voltage level than that of the data signal. In this manner latch circuitry is integrated with level shifting circuitry, thereby reducing circuitry area and power consumption without adversely impacting functionality and performance.

Objects, advantages and other forms of the invention will become apparent upon reading the following detailed description and upon reference to the accompanying drawings.

DETAILED DESCRIPTION OF A PREFERRED EMBODIMENT

The claims at the end of this application set out novel features which applicants believe are characteristic of the invention. The invention, a preferred mode of use, further objectives and advantages, will best be understood by reference to the following detailed description of an illustrative embodiment read in conjunction with the accompanying drawings.

Figure 1:
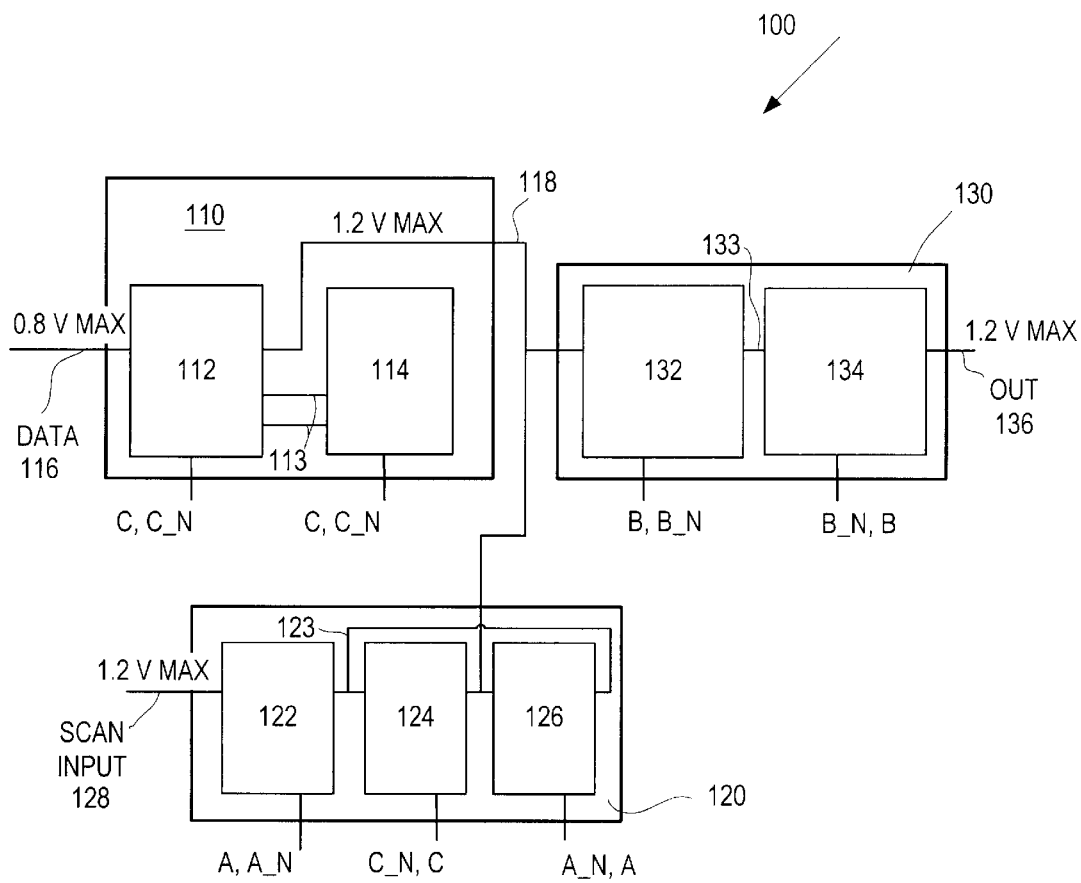
FIG. 1 illustrates level shifting, latch circuitry in a block diagram, according to an embodiment of the present invention.

Referring now to FIG. 1, a block diagram of latch circuitry 100 is shown, according to an embodiment of the present invention. "Latch circuitry," as the term is used herein, is circuitry which operates in cycles responsive to at least one timing signal. During a cycle the latch circuitry captures an input signal, that is, "data," at a latch input and holds the data at the latch output.

The latch circuitry 100 has a first input stage 110 for sampling a first input signal on an input node, that is, "data" 116, responsive to a clock signal C and a complement of the clock signal, C_N. The first input stage 110 has a first section 112 and second section 114 which are cross coupled by conductors 113, through which the sections 112 and 114 interact with one another. The data 116 has a maximum voltage level of 0.8 V. Responsive to sampling the data 116 and interacting with section 114, section 112 generates an output signal to an intermediate node 118 of the latch circuitry 100. More specifically, first section 112 responsively asserts a high or low voltage on its output node 118, or isolates itself from the output node 118. The voltage level of the high voltage state is 1.2V.

The latch circuitry 100 also has a second input stage 120, for sampling a second input signal on a second input node, that is, "scan input" 128, responsive to a clock signal A and a complement of the clock signal, A_N, as well as clock signals C and C_N. The scan input 128 signal has a maximum voltage level of 1.2 V. More specifically, the second input stage 120 has a first section 122 that samples the scan input 128 responsive to the clock signals A and A_N, and has an output node 123 coupled to the input of a second section 124 and the output of a third section 126. Responsive to the sampled scan input 128 and the clock signals A and A_N, the first section asserts a high or low voltage on its output node 123, or isolates itself from the output node 123. The voltage level of the high voltage state for the first section 122 is 1.2 V.

Second section 124 has an output node coupled to the previously mentioned intermediate node 118 and to the input of third section 126. Responsive its clock signals C and C_N and to the voltage asserted on its input 123 by either the first section 122 or third section 126 (or both), second section 124 asserts a high or low voltage on its output node 118, or isolates itself from the output node 118. The voltage level of the high voltage state for the second section 124 is 1.2 V.

Third section 126 has an output node 123, previously mentioned. Responsive its clock signals A and A_N and to the voltage asserted on its input 118 by the second section 124, third section 126 asserts a high or low voltage on its output node 123, or isolates itself from the output node 123. The voltage level of the high voltage state for the third section 126 is 1.2 V.

The latch circuitry 100 also has an output stage 130 coupled at its input to the intermediate node 118, for sampling the signal on the node 118 responsive to a clock signal B and complement of the clock signal, B_N. Responsive to sampling the signal at node 118, output stage 130 generates an output signal to an output node 136 of the latch circuitry 100. More specifically, The output stage 130 has a first section 132 with an output node 133 coupled to an input node of a second section 134. Responsive the signal on node 118 and the clock signals B and B_N, the first section 132 asserts a high or low voltage on its output node 133, or isolates itself from the output node 133. Responsive the signal on node 133 and the clock signals B and B_N, the second section 134 asserts a high or low voltage on its output node 136, or isolates itself from the output node 136. The output signal on the output node 136 has a maximum voltage level of 1.2 V, so that one overall effect of the latch circuitry is that the output signal has a higher maximum voltage level than that of the first input signal. That is, the circuitry 100 has, in effect, shifted the maximum voltage level of the first input signal.

Figure 2:
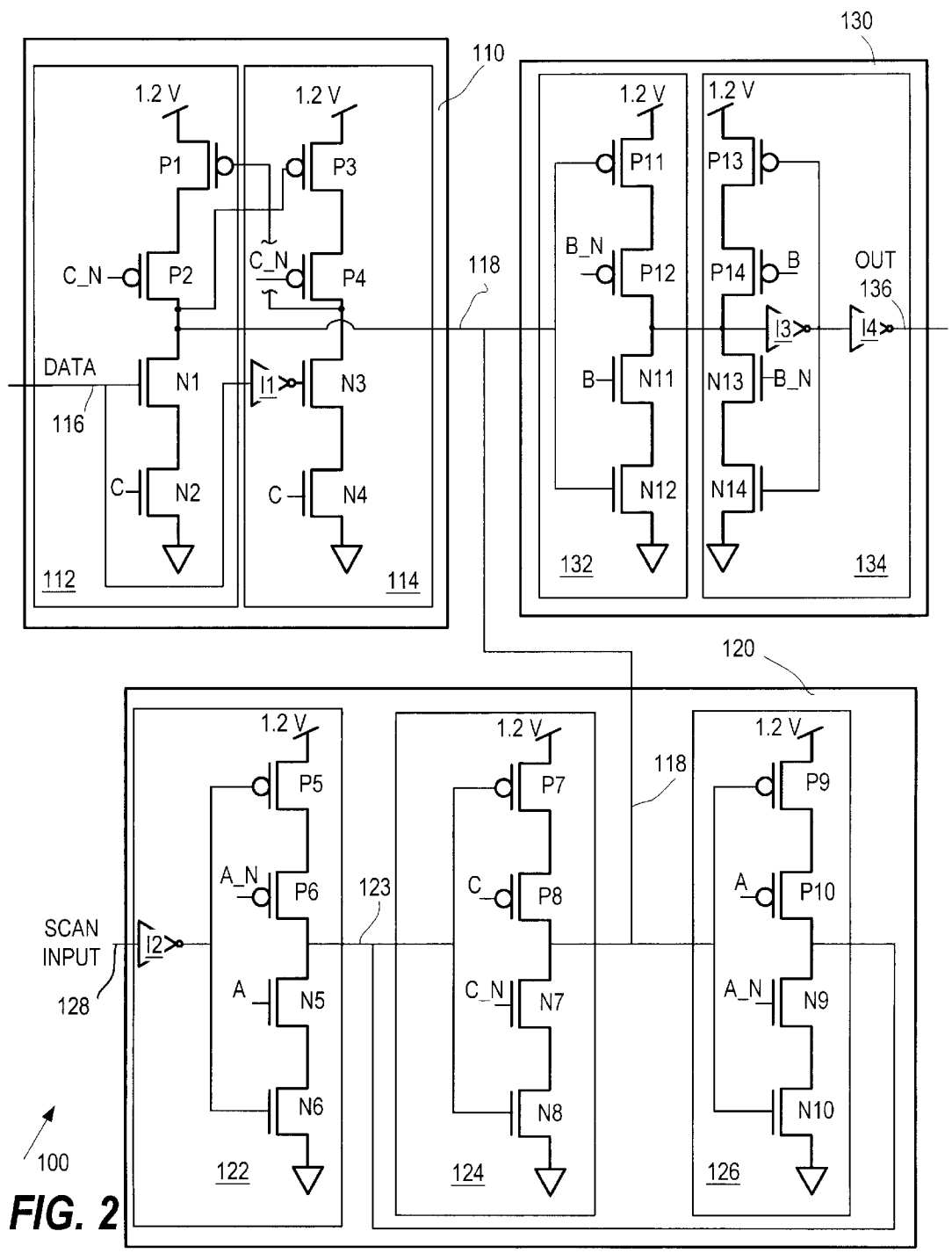
FIG. 2 illustrates certain additional details of the circuitry of FIG. 1, according to an embodiment of the present invention.

Referring now to FIG. 2, details are shown for latch circuitry 100, according to an embodiment of the invention. The first section 112 of the first input stage 110 has a stack of field effect transistors (FET's) P1, P2, N1, and N2. Specifically, the first conducting electrode of P1 is connected to a 1.2 V source. The second conducting electrode of P1 is connected to the first conducting electrode of P2. The second conducting electrode of P2 is connected to the first conducting electrode of N1. The second conducting electrode of the N1 is connected to the first conducting electrode of N2. The second conducting electrode of N2 is connected to ground. The second section 114 of the first input stage has a stack of FET's P3, P4, N3, and N4, which likewise have their conducting electrodes connected in series with the stack connected between 1.2 V and ground. Likewise, each of the other sections in circuitry 100, that is, sections 122, 124 and 126 of second input stage 120, and sections 132 and 134 of output stage 130, has a stack of two PFET's and two NFET's with their respective conducting electrodes connected in series with the stack connected between 1.2 V and ground.

The gate of P1 in the first section 112 is connected to the second conducting electrode of P4 in the second section 114, and likewise the gate of P3 is connected to the second conducting electrode of P2. (These connections are the cross coupling conductors 113 shown in FIG. 1. The gates of P2 and P4 are operatively coupled to the clock signal C_N. The gates of N2 and N4 are operatively coupled to the clock signal C. The gate of N1 is operatively coupled to the first input node, data 116, for receiving the first input signal. Data 116 is also coupled to the input of an inverter I1, which has its output coupled to the gate of transistor N3. The node formed by the connection of the second conducting electrode of P2 and the first conducting electrode of N1 is coupled to intermediate node 118.

The first section 122 of the second input stage 120 also has an inverter I2 with its input coupled to the second input node, scan input 128, and its output coupled to the gate of the top PFET in the stack, P5, and the bottom NFET in the stack, N6. The middle FET's, P6 and N5, in the stack of section 122 have their gates coupled to the clock signals A_N and A, respectively. The node formed by the connection of the second conducting electrode of P6 and the first conducting electrode of N5 is coupled to node 123, which is also coupled to the gate of the top PFET P7 in the second section 124 stack, and the bottom NFET in that stack, N8, and to the node in the third section 126 formed by the connection-of the second conducting electrode of P10 and the first conducting electrode of N9, i.e., the middle two FET's in the section 126 stack.

The middle two FET's P8 and N7 of the second section 124 have their gates operatively coupled to the clock signals C and C_N, respectively. Likewise, the middle two FET's P10 and N9 of the third section 126 have their gates operatively coupled to the clock signals A and A_N. The node in section 124 formed by the connection of the second conducting electrode of P8 and the first conducting electrode of N7 is coupled to node 118, which is also coupled to the gates of the top and bottom FET's P9 and N10 of the third section 126 stack in the second input stage 120.

The gates of the top and bottom FET's P11 and N12 of the first section 132 stack in the output stage 130 are also coupled to node 118. The middle two FET's P12 and N11 of the first section 132 have their gates operatively coupled to the clock signals B_N and B, respectively. The node in section 132 formed by the connection of the second conducting electrode of P12 and the first conducting electrode of N11 is coupled to the node formed by the connection of the second conducting electrode of FET P14 and the first conducting electrode of FET N13 of the second section 134. This node is also coupled to the input of an inverter I3, which has its output coupled to the gates of the top and bottom FET's P13 and N14 of the stack of section 132, and to the input of another inverter I4. Inverter I4 has its output coupled to the output node 136 for the circuitry 100.

Figure 3:
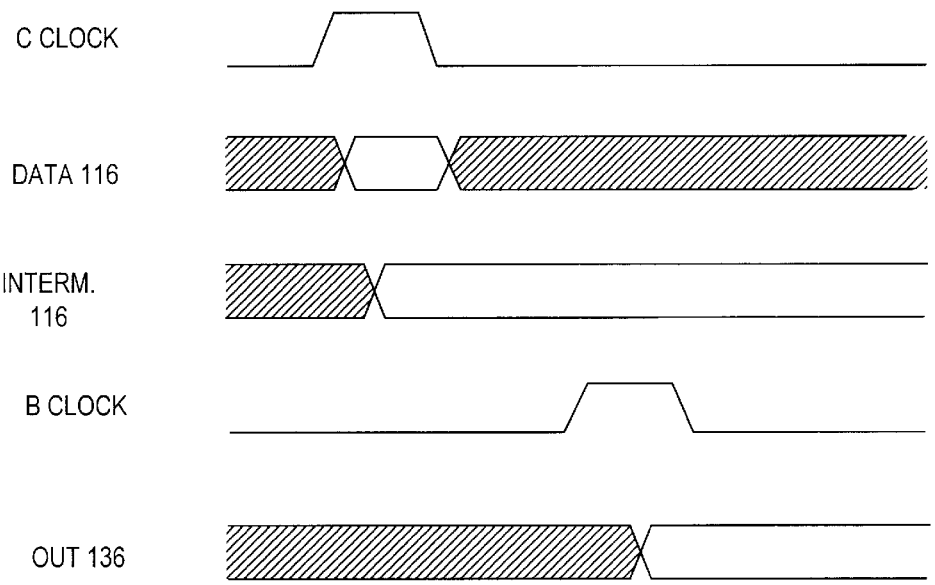
FIG. 3 illustrates timing of operation of the circuitry in a data capture mode, according to an embodiment of the present invention.

Referring now to FIG. 3, a timing diagram shown illustrating how circuitry 100 responds to an input signal on the first input node, data 116, with respect to the clock signals C and B. (It should be understood that complementary clock signals C_N and B_N also exist. ) For the mode of operation illustrated in FIG. 3, circuitry 100 is operable to capture the input signal, i.e., data, on data 116, and to ignore data at the scan input node 128. As shown, responsive to data being asserted during an interval when clock signal C is also asserted, the data is captured on immediate node 118. That is, node 118 is driven to the high or low state corresponding to the state of the data, but the high state of node 118 is 1.2 V instead of 0.8 V.

Note the effect of the cross coupling between the first section 112 and second section 114. The 0.8 V level of the data on the gate of FET N1 is not adequate to fully turn on FET N1, and thus not adequate to single-handedly fully turn on FET P3. However, since at least partly turning on N1 by asserting the 0.8 V data signal corresponds to at least partly turning off N3 through inverter I1. This tends to turn off P1, since the first conducting electrode of FET N3 is coupled back to the gate of FET P1, permitting N1 to even more fully pull down the voltage on node 118, which tends to more fully turn on P3, which tends to more fully turn off P1, which tends to allow N1 to more fully pull down node 118, and so on, so that node 118 is ultimately pulled up fully to 1.2 V despite the relatively lower 0.8 V maximum voltage of the data signal.

Next, responsive to the clock signal C being de asserted, FET's P2 and N2 are turned off, isolating input stage 110 from the node 118 and holding node 118 at the state which was captured when the C clock was asserted.

Then, responsive to the clock signal B being asserted, the output stage samples the voltage on the intermediate node 118 and drives the output node 136 to the opposite state. Next, responsive to the clock signal B being de asserted, FET's P12 and N11 turn off, isolating the output stage 130 from further changes on node 118 so that the output node remains at the state that has been captured by the B clock until the next time that the B clock is asserted.

During the data capture mode illustrated in FIG. 3, the A clock is deasserted (and A_N is asserted), so that P6 and N5 of section 122 are turned off, isolating the second input stage 120 from the scan input 128, so that any scan input signal has no effect on the circuitry 100 output.

Figure 4:
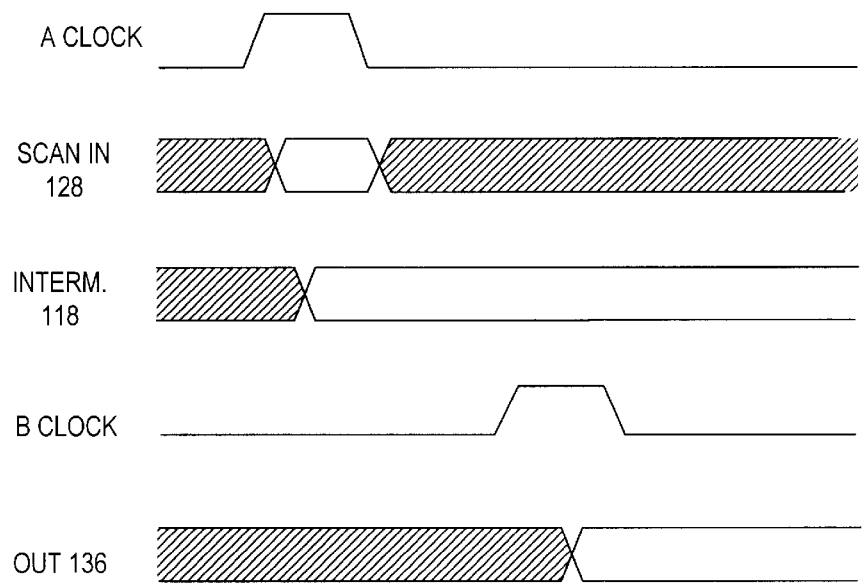
FIG. 4 illustrates timing of operation of the circuitry in a scan input capture mode, according to an embodiment of the present invention.

Referring now to FIG. 4, timing of operation of the circuitry 100 is illustrated in a scan input capture mode, according to an embodiment of the present invention. During the scan input capture mode the C clock is deasserted (and C_N is asserted), which turns off N2 and P2, among others, and thereby isolates the first input stage 110 from the data signal on data 118._Likewise, this turns on P8 and N7 permitting the second input stage to change node 118 responsive to the scan input signal on node 128 and clock signals A and A_N, so that the signal on scan input 128 is captured by the second input stage 120 and asserted on node 118 upon clock signal A being asserted, and the signal on node 118 is captured and passed to the output node 136 by the output stage 130 responsive to the clock signal B being asserted.

From the foregoing description it should be appreciated that the invention is advantageous in that latch circuitry is provided which has different inputs stages for regular data and a scan input. The data input stage has a level shifting topology as well as serving as a clocked input stage for latching.

The description of the present embodiment has been presented for purposes of illustration, but is not intended to be exhaustive or to limit the invention to the form disclosed. Many modifications and variations will be apparent to those of ordinary skill in the art. For example, if the scan input signal has a lower maximum voltage than desired for the output signal of latch circuitry 100 then the second input stage 120 can also include a first and second section like that of the first input stage 110. Alternatively, voltage level shifting can be done in a different stage than the input stage. For example, the signals throughout the circuitry 100 can have the same low maximum voltage as the signal received at the input, and the voltage level can be shifted only in the output stage 130.

In other embodiments, one or more of the maximum voltage levels are different than 0.8 V or 1.2 V.

To reiterate, the embodiments were chosen and described in order to best explain the principles of the invention, the practical application, and to enable others of ordinary skill in the art to understand the invention. Various other embodiments having various modifications may be suited to a particular use contemplated, but may be within the scope of the present invention. Moreover, it should be understood that the actions in the following claims do riot necessarily have to be performed in the particular sequence in which they are set out.

What is claimed is:

1. Latch circuitry, operable in cycles responsive to at least one timing signal, wherein during such a cycle the latch circuitry captures data at a latch input and holds data at a latch output, the latch circuitry comprising:

a first input stage for sampling a first input signal on a first latch input node responsive to a first timing signal, and generating a signal on an intermediate node in the latch circuitry;

a second input stage for sampling a second input signal on a second latch input node responsive to a second timing signal, and generating a signal on the intermediate node; and an output stage for generating an output signal on an output node of the latch circuitry responsive to the signal on the intermediate node and a third timing signal, wherein the first input signal has a maximum voltage level and at least one stage of the latch circuitry is operable to effectively shift the voltage level so that the output signal has a higher maximum voltage level than that of the first input signal.

2. The latch circuitry of claim 1, wherein the first input stage is operable to perform the voltage level shifting effect, so that the signal generated by the first input stage has a higher maximum voltage level than that of the first input signal.

3. The latch circuitry of claim 1, wherein the signal generated by the first input stage has a maximum voltage level substantially equal to that of the first input signal, and the output stage is operable to perform the shifting of the voltage level.

4. The latch circuitry of claim 1, wherein the second input signal has a maximum voltage level and the latch circuitry is operable to effectively shift the second input signal voltage level.

5. The latch circuitry of claim 1, wherein the at least one stage operable to effectively shift the voltage level has first and second cross-coupled stacks of transistors to feed signals from one stack to the other, to reduce contention among transistors in such a stack.

6. The latch circuitry of claim 5, wherein the first stack has a first P type transistor having a first conducting electrode coupled to a voltage source and a second conducting electrode coupled to the first conducting electrode of a second P type transistor, the second P type transistor has a second conducting electrode coupled to a first conducting electrode of a first N type transistor, the first N type transistor has a second conducting electrode coupled to a first conducting electrode of a second N type transistor, and the second N type transistor has a second conducting electrode coupled to ground, and wherein the cross-coupling includes a gate of one of the P type transistors in the first stack being coupled to one of the conducting electrodes of one of the P type transistors in the second stack.

7. The latch circuitry of claim 6, wherein gates of one of the first and second N type transistors and the other one of the first and second P type transistor in the first stack are respectively coupled to the timing signal for the stage and a complement of the timing signal.

8. The latch circuitry of claim 7, wherein a gate of the other one of the first and second N type transistors of the first stack is coupled to an input node for the stage, and one of the conducting electrodes of said other N type transistor is coupled to an output node for the stage.

9. A method for operating latch circuitry in cycles responsive to at least one timing signal, wherein during such a cycle the latch circuitry captures data at a latch input and holds data at a latch output, the method comprising the steps of:

sampling a first input signal on a first latch input node by a first input stage responsive to a first timing signal and responsively generating a signal on an intermediate node in the latch circuitry, or sampling a second input signal on a second latch input node of a second input stage responsive to a second timing signal and responsively generating a signal on the intermediate node; and generating an output signal on an output node of an output stage responsive to the signal on the intermediate node and a third timing signal, wherein the first input signal has a maximum voltage level and at least one stage of the latch circuitry is operable to effectively shift the voltage level so that the output signal has a higher maximum voltage level than that of the first input signal.

10. The method of claim 9, wherein the first input stage performs the voltage level shifting effect, so that the signal generated by the first input stage has a higher maximum voltage level than that of the first input signal.

11. The method of claim 9, wherein the signal generated by the first input stage has a maximum voltage level substantially equal to that of the first input signal, and the output stage performs the shifting of the voltage level.

12. The method of claim 9, wherein the second input signal has a maximum voltage level and the latch circuitry effectively shifts the second input signal voltage level.

13. The method of claim 9, wherein the at least one stage operable to effectively shift the voltage level has first and second cross-coupled stacks of transistors, and wherein sampling a first input signal on a first latch input node by a first input stage responsive to a first timing signal and responsively generating a signal on an intermediate node in the latch circuitry comprises:

feeding signals from one stack to the other, to reduce contention among transistors in such a stack.

14. The method of claim 13, wherein the first stack has a first P type transistor having a first conducting electrode coupled to a voltage source and a second conducting electrode coupled to the first conducting electrode of a second P type transistor, the second P type transistor has a second conducting electrode coupled to a first conducting electrode of a first N type transistor, the first N type transistor has a second conducting electrode coupled to a first conducting electrode of a second N type transistor, and the second N type transistor has a second conducting electrode coupled to ground, and wherein the feeding of signals from one stack to the other comprises:

feeding a signal to a gate of one of the P type transistors in the first stack from one of the conducting electrodes of one of the P type transistors in the second stack.

15. The method of claim 14, wherein gates of one of the first and second N type transistors and the other one of the first and second P type transistor in the first stack are respectively coupled to the timing signal for the stage and a complement of the timing signal.

16. The method of claim 15, wherein a gate of the other one of the first and second N type transistors of the first stack is coupled to an input node for the stage, and one of the conducting electrodes of said other N type transistor is coupled to an output node for the stage.

17. Latch circuitry, operable in cycles responsive to at least one timing signal, wherein during such a cycle the latch circuitry captures data at a latch input and holds data at a latch output, the latch circuitry comprising:

a first input stage for sampling a first input signal on a first latch input node responsive to a first timing signal, and generating a signal on an intermediate node in the latch circuitry;

a second input stage for sampling a second input signal on a second latch input node responsive to a second timing signal, and generating a signal on the intermediate node;

an output stage for generating an output signal on an output node of the latch circuitry responsive to the signal on the intermediate node and a third timing signal, wherein the first input signal has a maximum voltage level and at least one stage of the latch circuitry is operable to effectively shift the voltage level so that the output signal has a higher maximum voltage level than that of the first input signal, wherein the first input stage is operable to perform the voltage level shifting effect, so that the signal generated by the first input stage has a higher maximum voltage level than that of the first input signal, and wherein the first stage has first and second cross-coupled stacks of transistors to feed signals from one stack to the other, to reduce contention among transistors in such a stack.

18. The latch circuitry of claim 17, wherein the first stack has a first P type transistor having a first conducting electrode coupled to a voltage source and a second conducting electrode coupled to the first conducting electrode of a second P type transistor, the second P type transistor has a second conducting electrode coupled to a first conducting electrode of a first N type transistor, the first N type transistor has a second conducting electrode coupled to a first conducting electrode of a second N type transistor, and the second N type transistor has a second conducting electrode coupled to ground, and wherein the cross-coupling includes a gate of one of the P type transistors in the first stack being coupled to one of the conducting electrodes of one of the P type transistors in the second stack.

19. The latch circuitry of claim 18, wherein the second input signal has a maximum voltage level and the second input stage is operable to perform a voltage level shifting effect, so that the signal generated by the second input stage has a higher maximum voltage level than that of the second input signal, and wherein the second stage has first and second cross-coupled stacks of transistors to feed signals from one stack to the other, to reduce contention among transistors in such a stack.

20. The latch circuitry of claim 19, wherein the first stack of the second stage has a first P type transistor having a first conducting electrode coupled to a voltage source and a second conducting electrode coupled to the first conducting electrode of a second P type transistor, the second P type transistor has a second conducting electrode coupled to a first conducting electrode of a first N type transistor, the first N type transistor has a second conducting electrode coupled to a first conducting electrode of a second N type transistor, and the second N type transistor has a second conducting electrode coupled to ground, and wherein the cross-coupling in the second stage includes a gate of one of the P type transistors in the first stack of the second stage being coupled to one of the conducting electrodes of one of the P type transistors in the second stack of the second stage.

* * * * *